United States Patent
Lindemuth (10) Patent No.: US 10,073,151 B2
(45) Date of Patent: *Sep. 11, 2018

(54) FAST HALL EFFECT MEASUREMENT SYSTEM

(71) Applicant: Lake Shore Cryotronics, Inc., Westerville, OH (US)

(72) Inventor: Jeffrey R. Lindemuth, Galena, OH (US)

(73) Assignee: Lake Shore Cryotronics, Inc., Westerville, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/782,067

(22) Filed: Oct. 12, 2017

(65) Prior Publication Data

US 2018/0031648 A1    Feb. 1, 2018

Related U.S. Application Data

(63) Continuation of application No. 14/996,719, filed on Jan. 15, 2016, now Pat. No. 9,797,965.

(51) Int. Cl.
    *G01R 33/12*    (2006.01)
(52) U.S. Cl.
    CPC ..................... *G01R 33/12* (2013.01)
(58) Field of Classification Search
    CPC ....................................................... G01R 33/12
    See application file for complete search history.

(56) References Cited

U.S. PATENT DOCUMENTS

| | | | |
|---|---|---|---|
| 5,424,561 A | 6/1995 | Tachibana et al. | |
| 5,604,433 A | 2/1997 | Theus et al. | |
| 6,064,202 A | 5/2000 | Steiner et al. | |
| 9,797,965 B2* | 10/2017 | Lindemuth | ............ G01R 33/12 |
| 2001/0050557 A1 | 12/2001 | Kempe | |
| 2002/0175679 A1 | 11/2002 | Kim et al. | |
| 2008/0238410 A1* | 10/2008 | Charlier | ............ G01R 33/0017 324/202 |
| 2009/0045807 A1 | 2/2009 | Nishida et al. | |
| 2014/0070796 A1 | 3/2014 | Reymond et al. | |
| 2016/0061912 A1 | 3/2016 | van Vroonhoven et al. | |

OTHER PUBLICATIONS

Bellekom, S. CMOS versus bipolar Hall plates regarding offset correction. Sensors and Actuators A: Physical 76, 178-182, doi:http://dx.doi.org/10.1016/S0924-4247(99)00007-2 (1999).

Bellekom et al., Offset Reduction of Hall Plates in Three Different Crystal Planes, Sensors and Actuators A 66 (1998), pp. 23-28.

(Continued)

*Primary Examiner* — Clayton E Laballe
*Assistant Examiner* — Jas Sanghera
(74) *Attorney, Agent, or Firm* — Calfee, Halter & Griswold LLP (57) ABSTRACT

A method and system for measuring Hall effect in a material includes measuring a voltage in two test states, each state alternating the direction and orientation of a current applied across the material or the voltage measured across the material relative to a magnetic field in each state. According to an embodiment, the frequency of measurement at each state differs.

31 Claims, 8 Drawing Sheets

(56) References Cited

OTHER PUBLICATIONS

Cornils, M. & Paul, O. Reverse-magnetic-field reciprocity in conductive samples with extended contacts. Journal of Applied Physics 104, 024505, doi:10.1063/1.2951895 (2008).

Levy, M. & Sarachik, M. P. Measurement of the Hall coefficient using van der Pauw method without magnetic field reversal. Review of Scientific Instruments 60, 1342, doi:10.1063/1.1140990 (1989).

Müller-Schwanneke, C., Jost, F., Marx, K., Lindenkreuz, S. & von Klitzing, K. Offset reduction in silicon Hall sensors. Sensors and Actuators A: Physical 81, 18-22.

Munter, P. J. A. A low-offset spinning-current hall plate. Sensors and Actuators A: Physical 22, 743-746.

Munter, P. J. A. Electronic circuitry for a smart spinning-current Hall plate with low offset. Sensors and Actuators A: Physical 27, 747-751.

Paste, M., Kayal, M. & Blanchard, H. A Hall Sensor Analog Front End for Current Measurement With Continuous Gain Calibration. Sensors Journal, IEEE 7, 860-867.

Riss, O., Shaked, E, Karpovsky, M. & Gerber, A. Offset reduction in Hall effect measurements using a nonswitching van der Pauw technique. The Review of scientific instruments 79.

Sample, H. H., Bruno, W. J., Sample, S. B. & Sichel, E. K. Reverse-field reciprocity for conducting specimens in magnetic fields. Journal of Applied Physics 61, 1079-1084.

Steiner, R., Maier, C., Hàberli, A., Steiner, F. P. & Baltes, H. Offset reduction in Hall devices by continuous spinning current method. Sensors and Actuators A: Physical 66, 167-172.

Steiner, R., Maier, C., Mayer, M., Bellekom, S. & Baltes, H. Influence of mechanical stress on the offset voltage of Hall devices operated with spinning current method. Microelectromechanical Systems, Journal of 8, 466-472.

Tai, C. T. Complementary reciprocity theorems for two-port networks and transmission lines. Education, IEEE Transactions on 37, 42-45.

Udo, A. In Sensors, 2004. Proceedings of IEEE. 1117-1120 vol. 1113.

van der Meer, J. C. et al. In Sensors, 2004. Proceedings of IEEE 1434-1437 vol. 1433.

International Search Report and Written Opinion from International Application No. PCT/US16/65747 dated Mar. 2, 2017 (12 pages).

Office Action from U.S. Appl. No. 14/996,719 dated Feb. 24, 2017.

Amendment from U.S. Appl. No. 14/996,719 dated May 9, 2017.

Notice of Allowance from U.S. Appl. No. 14/996,719 dated Sep. 20, 2017.

* cited by examiner

FAST HALL EFFECT MEASUREMENT SYSTEM

CROSS REFERENCE TO RELATED APPLICATIONS

This application claims priority to, and the benefits of, U.S. application Ser. No. 14/996,719, filed on Jan. 15, 2016, which is incorporated by reference herein in full.

TECHNICAL FIELD

The present invention relates generally to a method for measuring materials properties, and more particularly to a method for measuring Hall effect voltage.

BACKGROUND OF THE INVENTION

When a magnetic field is applied perpendicular to a current flowing in a finite size semiconducting material, the combination of the current and magnetic field produces a Lorentz force on carriers within the semiconducting material. This force pushes the carriers into circular paths around the magnetic field lines. The carriers are constrained within the material, which creates an electric field perpendicular to both the current and the magnetic field. The voltage produced by this electric field is called the Hall effect voltage, or Hall voltage.

A steady state condition is reached when the force from the transverse electric field exactly cancels the Lorentz force. Accordingly, in this state the Hall voltage is proportional to the magnetic field and current, and depends inversely on the thickness of the material. The proportionality constant is called the Hall coefficient. The Hall coefficient and resistivity of the material can be related to the material properties carrier density and carrier mobility. The sign of the Hall voltage is the same as the sign of the charge of the carriers and thus provides a determination of carrier type (holes or electrons).

In an ideal geometry, the measured Hall voltage is zero when the applied magnetic field is zero. The voltage measured in a practical experiment, however, is typically not zero, and includes a misalignment voltage and a thermal electric voltage. The misalignment voltage is proportional to the resistivity of the material, the current, and a factor that depends on the geometry. This factor converts resistivity to resistance between two Hall voltage probes. The thermal electric voltage arises from contacts between two different materials and is dependent on the thermal gradients present.

One method for measuring Hall effect involves application of a DC magnetic field to piece of material. In this method, the effects of the thermal electric voltage can be removed by changing the direction of the current applied across the material and measuring the voltage for both current directions. Thermal electric voltage does not depend on current. Thus, the effect of the thermal electric voltage is removed by subtracting the measured voltage at the two different currents.

Similarly, using a DC magnetic field, the misalignment voltage can be removed by changing the direction of the magnetic field and measuring the voltage for both field directions. Misalignment voltage does not depend on magnetic field. Thus, the effect of the misalignment voltage is removed by subtracting the measured voltage at the two different currents.

While the DC-field method may be advantageous for high-mobility materials, it often fails to provide accurate measurements for low-mobility materials, i.e., materials with a mobility less than $1$ $cm^2/Vs$. In low-mobility materials, the difference between the voltage measurements at each field direction becomes much smaller compared to the misalignment voltage. As a result, noise in the system can dominate the measurement and produce inaccurate results. Accordingly, Hall measurements using the DC-field method on low-mobility materials often give inconsistent values and carrier signs.

To increase the accuracy of measurements on low-mobility materials, larger magnetic fields are sometimes used, the reversal of which can take a long time, e.g., several minutes, depending on a magnet's configuration. During the time it takes to reverse the DC field, the temperature of the measured material may change. A change in temperature will cause a change in the misalignment voltage between measurements, leading to an incorrect result when the two measurements are subtracted.

Another method of measuring Hall effect uses an AC magnetic field. Because the misalignment voltage is not dependent on the magnetic field, it will remain a DC voltage while the Hall voltage is an AC voltage. A DC current is still used in this method, meaning that the thermal electric voltage also remains a DC voltage. A lock-in amplifier can then be used to easily separate the AC and DC voltages and thus the misalignment voltage from the Hall voltage.

The AC-field method solves some of the problems inherent in the DC-field method. Particularly, the separation of voltages in frequency space allows for much easier detection of smaller voltage differences, for example when measuring low-mobility carriers.

The AC-field method, however, suffers from a large drawback: in actual use it can be slow. The speed is determined by the frequency of the magnetic field. For real magnets and power supplies, the highest operating frequency can be approximately 0.1 Hz (10 seconds per cycle), as determined by the inductance of the magnet. Typically, a lock-in amplifier uses 6 cycles of input for best averaging of the output signal. Thus, a single Hall voltage measurement may take 60 seconds. Further, adding current reversal, which is required to remove the thermal electric voltages and phase errors, a total of 6 measurements are required, making the time to measure a Hall voltage 6 minutes. In practice, this Hall measurement is repeated from 10 to 100 times to get average values and an estimation of statistical variations. In sum, full measurement of a single material can take up to 10 hours under this method.

If the carrier density of a material is large, the Hall voltage will be small. To measure such materials, increasing the current will increase the Hall voltage. However, when the current is increased, self-heating can cause the temperature of the material to change. Specifically, the sample and contacts will have some resistance and power will be dissipated in the sample. This power will heat up the sample. The misalignment voltage is proportional to the resistivity of the material. As the temperature of the sample changes, the resistance changes and hence the misalignment voltage changes. In effect, a term that was a DC signal becomes a time dependent signal that will be detected by the lock-in amplifier in addition to the Hall voltage. The slowly-changing misalignment voltage will look like noise in the measurement. Additional noise comes from the Johnson-Nyquist noise due to material resistance. These two noise contributions to the measurements limit the ability of the AC field Hall method to measure small Hall voltages.

Accordingly, a system and method is needed for more quickly and accurately measuring Hall voltages, particularly for low-mobility materials.

SUMMARY

Embodiments of the present invention comprise systems and methods of measuring the Hall effect voltage of a material. In one embodiment, a first test state is provided alternating a first test parameter at a first frequency. A second test state is provided alternating a second test parameter at a second frequency. The first test parameter is one of a test excitation, a location of the test excitation, a direction of a magnetic field and a location of the magnetic field, and the second test parameter is another of the test excitation, the location of the test excitation, the direction of a magnetic field and the location of the magnetic field.

According to another embodiment, a system for measuring the Hall effect voltage of a material includes a magnet, test excitation mechanism, a voltage measuring device and a control configured to provide a first test state alternating a first test parameter at a first frequency and a second test state alternating a second test parameter at a second frequency. The first test parameter is one of a test excitation, a location of the test excitation, a direction of a magnetic field and a location of the magnetic field, and the second test parameter is another of the test excitation, the location of the test excitation, the direction of a magnetic field or the location of the magnetic field.

Further limitations and disadvantages of conventional, traditional, and proposed approaches will become apparent to one of skill in the art, through comparison of such approaches with embodiments of the present invention as set forth in the remainder of the present application with reference to the drawings.

BRIEF DESCRIPTION OF THE DRAWINGS

These and other features and advantages of the present invention will become better understood with regard to the following description and accompanying drawings in which.

DETAILED DESCRIPTION

FIGS. 1a-1h illustrate several states of two exemplary systems for detecting Hall voltage in an exemplary piece of material 100. Generally, for a given piece of material, when a current I and magnetic field B are perpendicularly applied to the material, theoretically, a resulting Hall voltage $V_H$ dependent on the material's Hall factor $R_H$, can be measured perpendicular to the plane created by the current and magnetic field. Reference axes 101 and 103 illustrate the physical relationship between these elements in two different configurations. As described above, the actual measured voltage $V_m$, however, includes other voltage components. Specifically, a misalignment voltage $V_{ma}$ may appear based on the resistivity $\rho$, and geometrical factor $\alpha$ of the piece of material $$\left( V_{ma} = I \frac{\alpha \rho}{t} \right).$$

Further, the measurement may include a thermal-electric voltage $V_{te}$. With those components added, the measured voltage should be equal to:

$$V_m = I \frac{R_H B}{t} + I \frac{\alpha \rho}{t} + V_{te}$$

The exemplary piece of material 100 of FIGS. 1a-1d is substantially square in shape, though as explained more fully herein, other shapes may be used. The piece of material 100 includes four contact points, 102, 104, 106 and 108, arranged around outer edges of the material 100, creating two pairs of generally opposite contact points. The piece of material may be any material for which Hall measurement is desired. Generally the thickness of the material may be any size but for practical measurements the thickness should be less than 2 mm. Smaller thickness will increase the Hall voltage, but will also increase the misalignment voltage. A current flow I 110 runs in the direction indicated by the arrow. A magnetic field B (not shown except in axes 101) is directed perpendicular to the surface area of the piece of material 100.

Figure 1A:
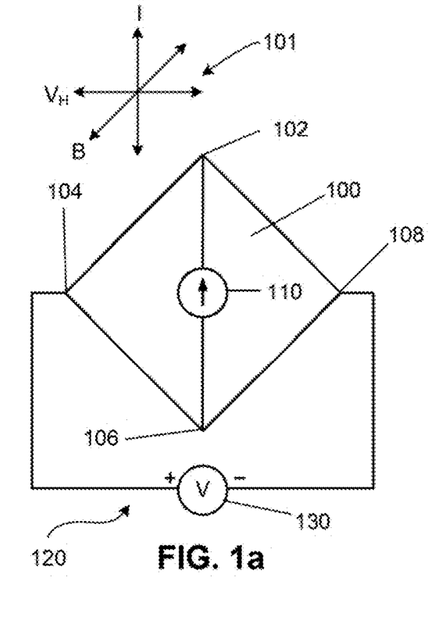
FIGS. 1a-1h are exemplary schematic diagrams of several different states of a Hall measurement device according to the present invention.

FIG. 1a illustrates a first measuring state 120. In state 120, the current I 110 runs from contact point 106, through the material 100, to contact point 102. A first voltage $V_{m_1}$ 130 is measured across contact points 104 and 108 and may be defined as follows:

$$V_{m_1} = I \frac{R_H B}{t} + I \frac{\alpha \rho}{t} + V_{te_1}$$

Figure 1B:
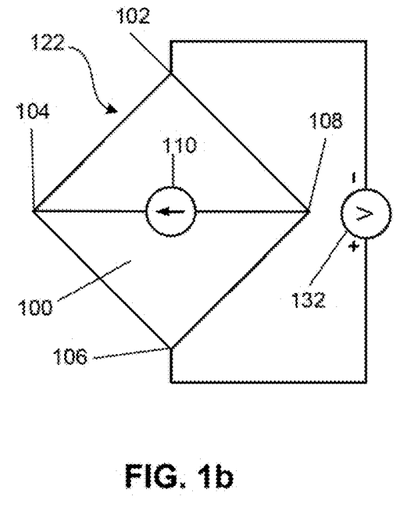

FIG. 1b illustrates a second measuring state 122. In state 122, the same current I 110 now runs from contact point 108, through the material 100, to contact point 104 and a second voltage $V_{m_2}$ 132 is measured across contact points 106 and 102. The Onsager relationship and H. H. Sample (Sample, H. H. and Bruno, W. J. and Sample, S. B. and Sichel, E. K., Journal of Applied Physics, 61, 1079-1084 (1987)) teaches us that the change in position of the current flow I 110 relative to the magnetic field B causes the above equation for $V_{m_1}$ to change such that B is replaced with $-B$. Also, because the voltage leads are on different contact points, the thermal voltage $V_{te_2}$ will be different, leading to the following equation:

$$V_{m_2} = -I \frac{R_H B}{t} + I \frac{\alpha \rho}{t} + V_{te_2}$$

Figure 1C:
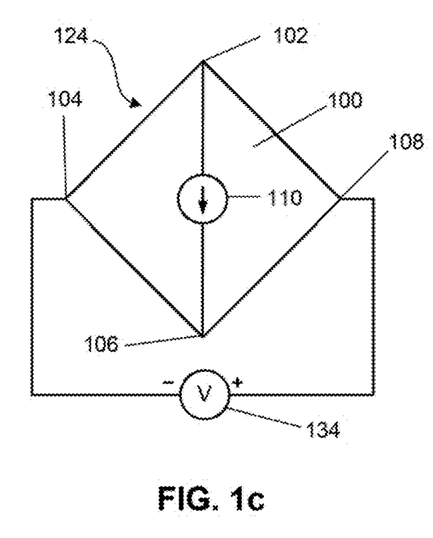

FIG. 1c illustrates a third measuring state 124. In state 124, the same current I 110 now runs from contact point 102, through the material 100, to contact point 106 and a third voltage $V_{m_3}$ 134 is measured across contact points 104 and 108. The reversal of current flow I 110 relative to the first state 120 will cause the current I 110 to be negative in the equation, but because the same contact points are used, the thermal electric voltage will be the same $V_{te_1}$ as in state 120. The following equation defines state 124:

$$V_{m_3} = -I\frac{R_H B}{t} - I\frac{\alpha\rho}{t} + V_{te_1}$$

Figure 1D:
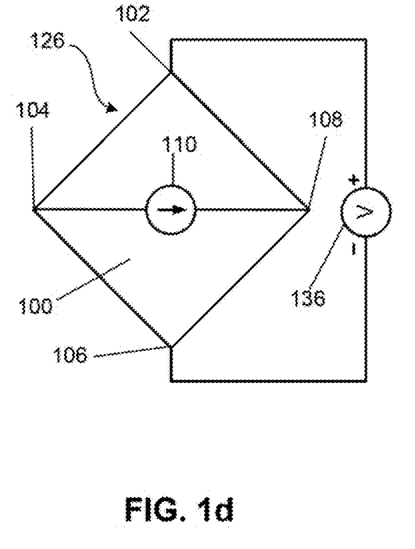
Figure 1E:
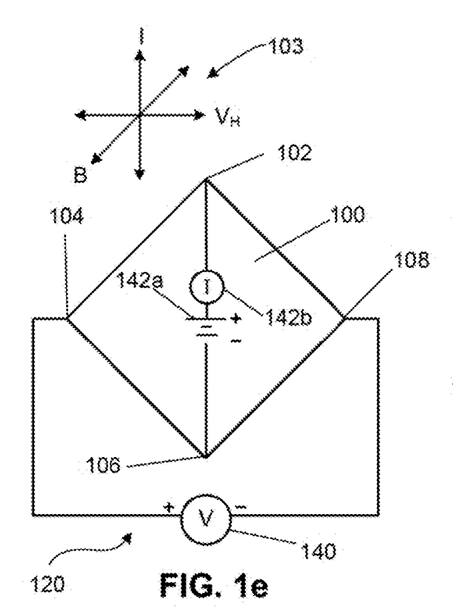
Figure 1F:
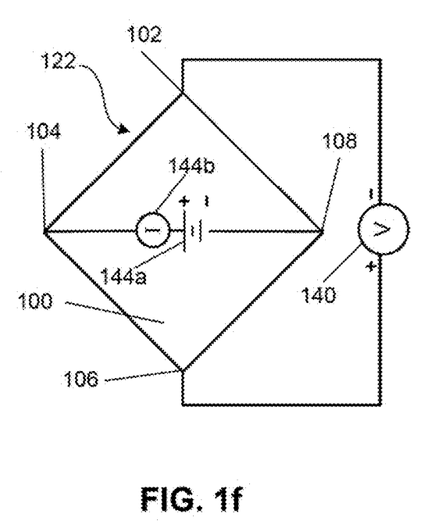
Figure 1G:
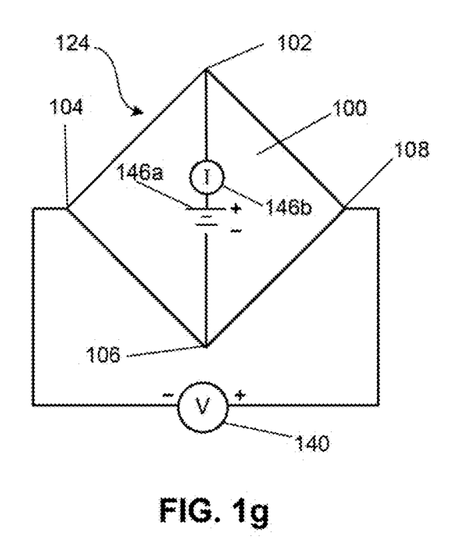
Figure 1H:
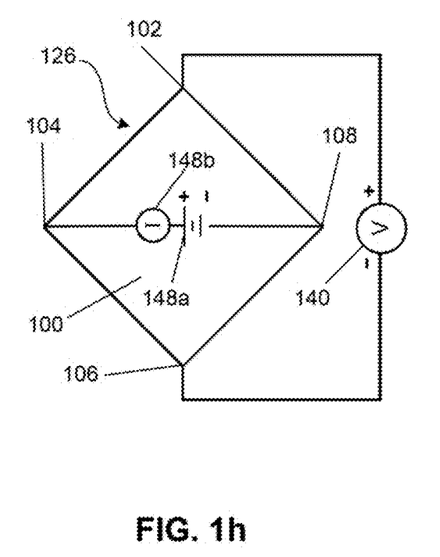

FIG. 1d illustrates a fourth measuring state 126. In state 126, the same current I 110 now runs from contact point 104, through the material 100, to contact point 108 and a fourth voltage $V_{m_4}$ 136 is measured across contact points 102 and 106. The reversal of current flow I 110 relative to the second state 122 will again cause the current I 110 to be negative in the equation, but because the same contact points are used, the thermal electric voltage will be the same $V_{te_2}$ as in that state. Also, like state 122, the change in position of the current flow I 110 relative to the magnetic field B causes the equation to change such that B is replaced with −B:

$$V_{m_4} = I\frac{R_H B}{t} - I\frac{\alpha\rho}{t} + V_{te_2}$$

The Hall voltage for the piece of material 100 can then be calculated from the above equations as $V_{m_1} - V_{m_2} - V_{m_3} + V_{m_4}$ which will remove the misalignment and thermal-electric voltages from the equation. Switching between states 120, 122, 124 and 126 requires only switching contact points for voltage measurement and current flow. Because no field reversal is necessary, the time for polarity reversal of large magnets is no longer an issue.

It will be appreciated by one of ordinary skill in the art, as seen in the above equations, that the Hall coefficient and related properties of a material can be determined by application of a current and measurement of a resulting voltage or by application of a voltage to generate a current and measurement of a resulting voltage. FIGS. 1e-1h illustrate this alternate embodiment wherein a specific voltage 142a, 144a, 146a and 148a is applied with resulting currents 142b, 144b, 146b and 148b generated, and resulting voltages $V_m$ 140 are measured. Whichever method of excitation is used on the material (i.e., current or voltage), it is still possible to use the above equations, after measuring currents with present method or system, to determine Hall effect properties. However, in either embodiment, alternating the magnetic field B instead of current I 110 can be used to create states with similar results.

Figure 2:
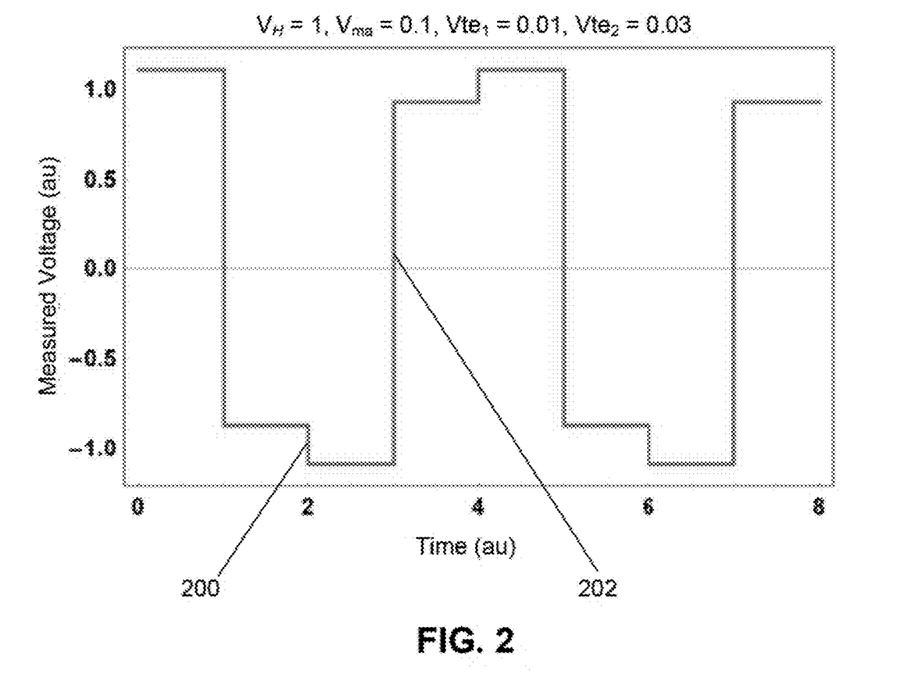
FIG. 2 is a signal output from a first exemplary Hall measurement device for a high-mobility material.

The above method, however, may still fail to accurately measure Hall voltage in low-mobility carriers with high misalignment voltage. When the above states are repeated in order, Hall voltage and misalignment voltage will change at the same frequency, but with a phase shift between the two. In materials with normal or high carrier mobility, the misalignment voltage is the same order of magnitude or smaller than the Hall voltage. Thus, the separation in phase space is sufficient to get a measurement of Hall voltage without contribution from the misalignment voltage. An exemplary voltage measurement for a high-mobility carrier is shown in FIG. 2. The misalignment voltage, seen as the change in amplitude at point 200 and similar points of the signal, is easily separable from the Hall voltage, which is seen as the large change in amplitude at 202 and similar points.

Figure 3:
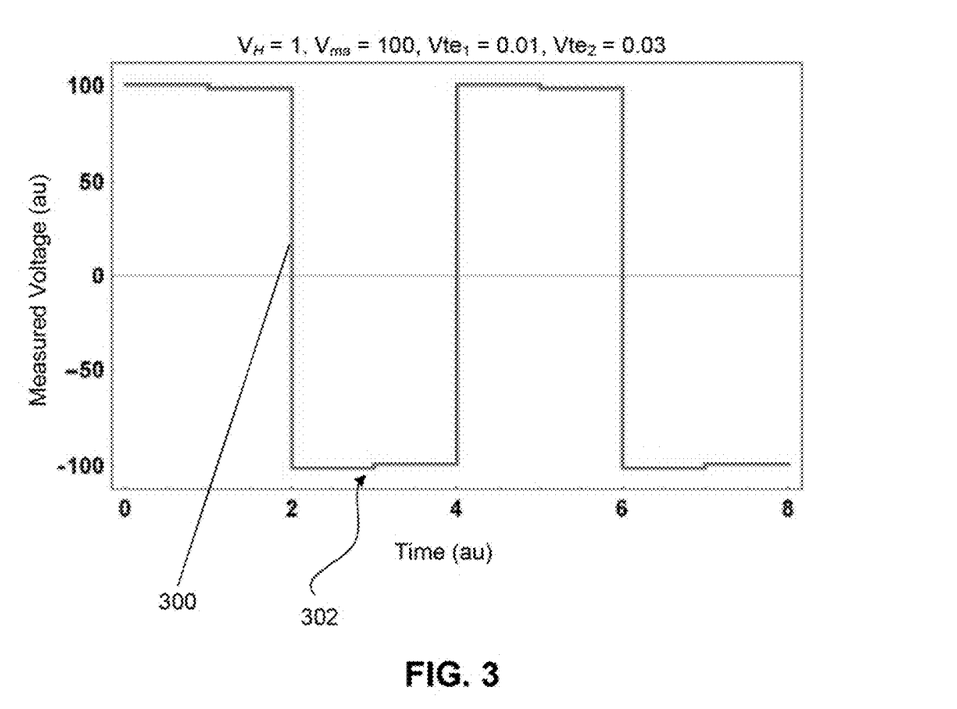
FIG. 3 is a signal output from the first exemplary Hall measurement device for a low-mobility material.

For low-mobility materials, however, the misalignment voltage is typically very large compared to the Hall voltage. Accordingly, it may be difficult, if not impossible, to separate the Hall voltage from the misalignment voltage, as both occur at the same frequency. An exemplary voltage measurement is shown in FIG. 3. As can be seen, the misalignment voltage, seen as the change in amplitude at point 300 and similar points of the signal, dominates the square wave. By contrast, the Hall voltage, the tiny change in amplitude at 302 and similar points, will be very difficult to measure.

The above problem in measuring Hall voltage for low-mobility carriers can be overcome by modifying the above method to vary the frequency between the misalignment voltage and Hall voltage. Returning briefly to FIGS. 1a-1d, the misalignment voltage, which does not depend on the magnetic field, remains constant between states 120 and 122 and between states 124 and 126, while at the same time the Hall Voltage, which does depend on the magnetic field, reverses sign. Thus, non-sequential switching techniques create different frequencies between the misalignment voltage and Hall voltage. For example, by switching between states 122 and 124 for a certain number of cycles, and then switching between states 124 and 126 for a certain number of cycles, rather than simply measuring each state for a single cycle in order, the Hall voltage and misalignment voltage are set to differing frequencies.

Figure 4:
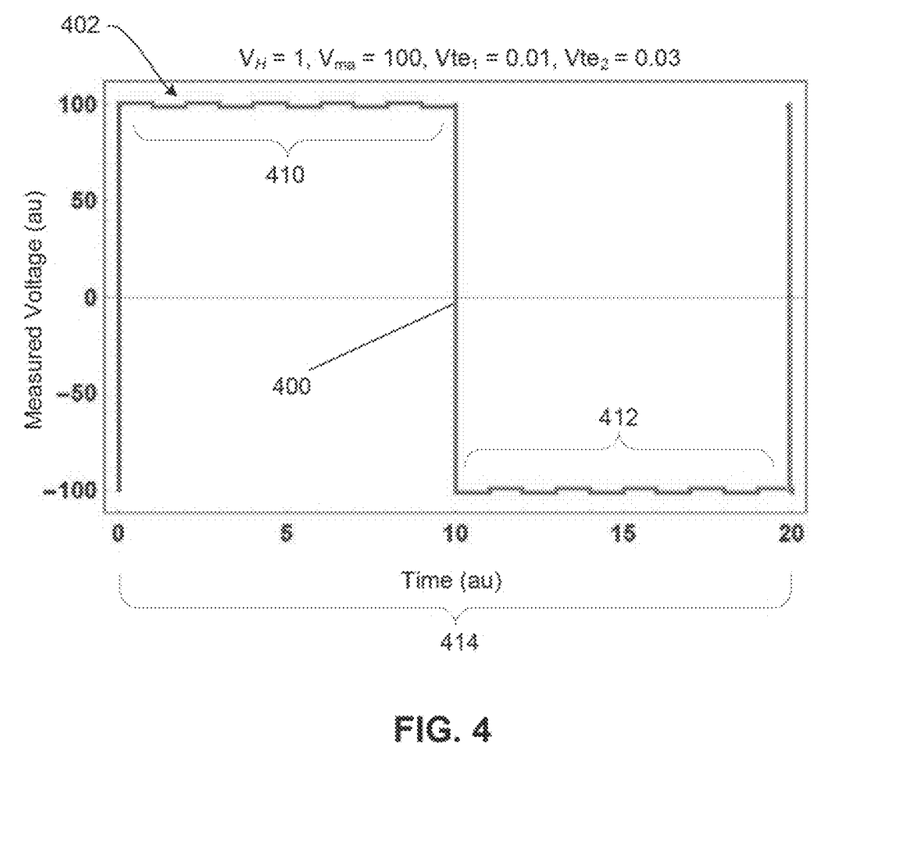
FIG. 4 is a signal output from a second exemplary Hall measurement device for a low-mobility material according to the present invention.
Figure 5:
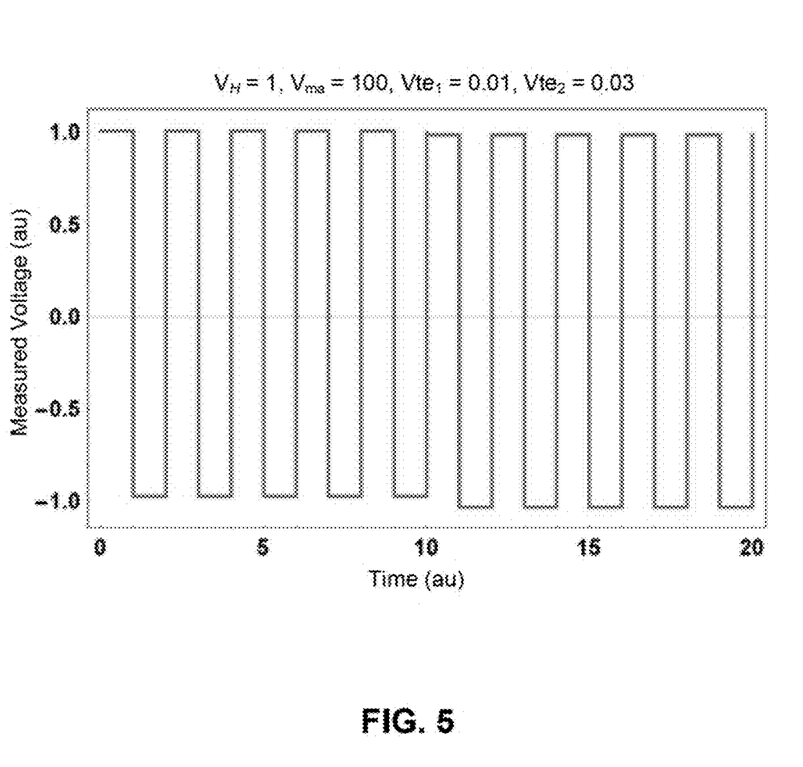
FIG. 5 is the signal output of FIG. 4 after exemplary conditioning according to the present invention.

FIG. 4 shows an exemplary voltage measurement technique using an exemplary switching pattern as described above. While this misalignment voltage 400 is still very large compared to the Hall voltage 402, the Hall voltage 402 is now toggled at a different frequency than the misalignment voltage 400. A demodulation may then be used, for example a double demodulation, on the signal to separate out the Hall voltage, followed by an amplifier, e.g., an AC-coupled amplifier, to measure the Hall voltage. An amplified version of the demodulated Hall voltage from FIG. 4 is shown in FIG. 5. As can be seen, the Hall voltage is now easily measurable.

As will be described below in further detail, the different measurements are more easily discernible from the voltage measurement of FIG. 4. For example, the switching between first and seconds states occurs over the period 410 (or n cycles as used below) and the switching between third and fourth states occurs over the period 412 (or m cycles as used below). The entire period of the measurement 414 corresponds to the total number of cycles (p, as used below) for the measurement.

Figure 6:
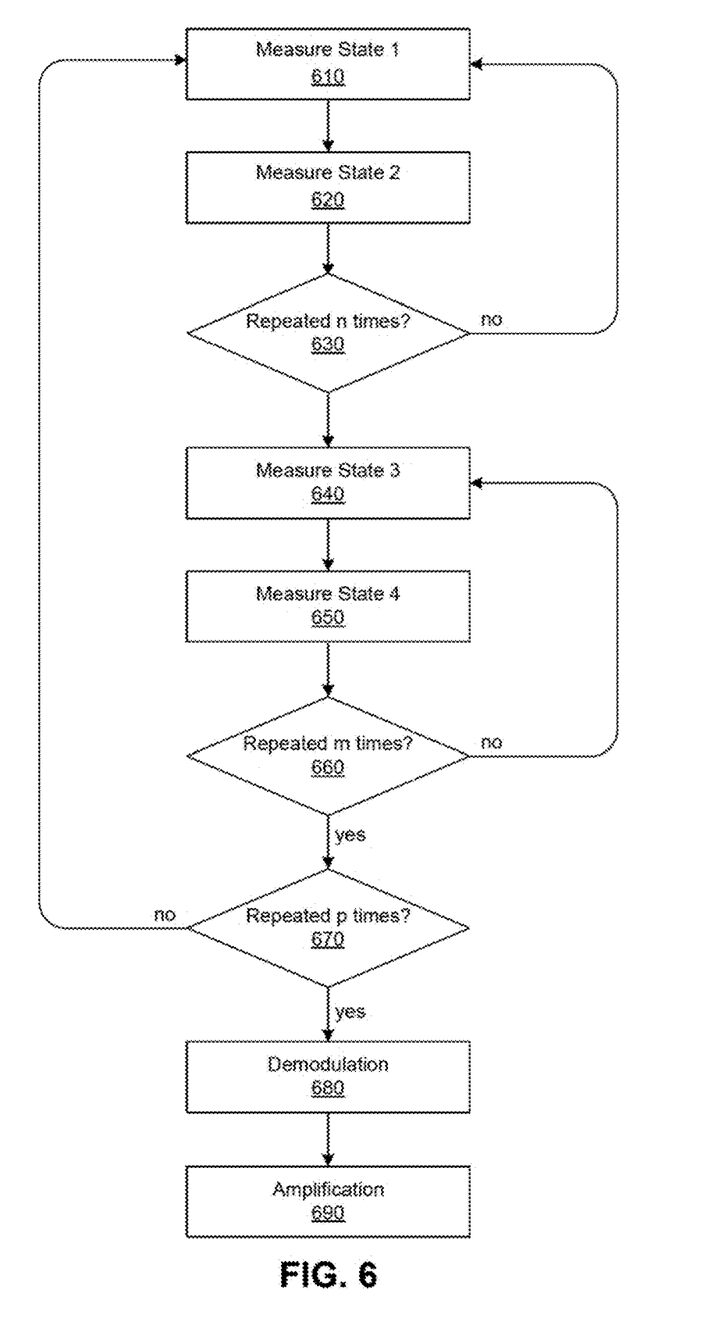
FIG. 6 is a flow chart illustrating a method of measuring a Hall voltage according to the present invention.

The above described method for measuring Hall voltage of a material is more clearly illustrated in the flow chart of FIG. 6. At step 610, voltage is measured in a first state, with a current flowing in a first direction across the material and a voltage signal measured across a perpendicular direction. At step 620, voltage is measured in a second state where the current is switched to flow perpendicular to its previous direction and the voltage signal is measured perpendicular to the new current direction. Steps 610 and 620 are repeated n times at step 630 before moving to step 640. The repetition count n may be any number of times, for example in the range of 1-10 times, but may be greater.

At step 640, the current is switched to flow in the opposite direction as in step 610, with the voltage signal again measured in this third state across a perpendicular direction. At step 650, voltage is measured in a fourth state where the current is switched to flow perpendicular to its previous direction and opposite the current of step 620. The voltage signal is measured perpendicular to the new current direction. Steps 640 and 650 are repeated m times at step 660. The repetition count m may be any number of times, for example in the range of 1-10 times, but may be greater. The method then returns to step 610 and steps 610-660 are repeated as described above p times at step 670, until the desired quantity of measurement has been completed. The repetition count p may be any number of times, for example in the range of 1-10 times, but may be greater.

Referring briefly back to FIGS. 1a-1h, exemplary corresponding states are shown. For example, using the above-described pattern, a measurement can toggle between states 120 and 122 n times, then toggle between states 124 and 126 m times, repeating the process for a total of p times.

Using the above technique, many toggling patterns are possible. For example, n and m may be equal, resulting in two frequencies, one each for Hall voltage and misalignment voltage, or n and m may be different, creating two frequencies each for the two voltages. In some cases of n and m, the totality of measurements p may not be much larger than each of the individual sets of cycles n and m, and in other cases p may be much larger than n and m, providing for a larger measurement sample. In all cases, the individual measurements at each state are recorded in time to create a continuous voltage-measurement signal.

Returning to FIG. 6, once the desired quantity of measurements at steps 610-660 have been completed at step 670, the method moves to step 680 where the measured signal is demodulated, e.g., by double demodulation. Finally, at step 690, the demodulated signal is amplified, e.g., by AC-coupled amplification.

It should be understood that there are many ways to achieve frequency separation between the Hall voltage and misalignment voltage according to the present invention. For example, FIG. 6 shows steps 610 and 620 being repeated n times. The number of repeated cycles n can be any number sufficient to effectuate practical demodulation. Moreover, while FIG. 6 shows steps 640 and 650 being repeated a different number of times, i.e., m times, it is contemplated that the number of cycles repeated between steps 640 and 650 may be the same as the number of cycles repeated between steps 610 and 620, i.e., n times.

Figure 7:
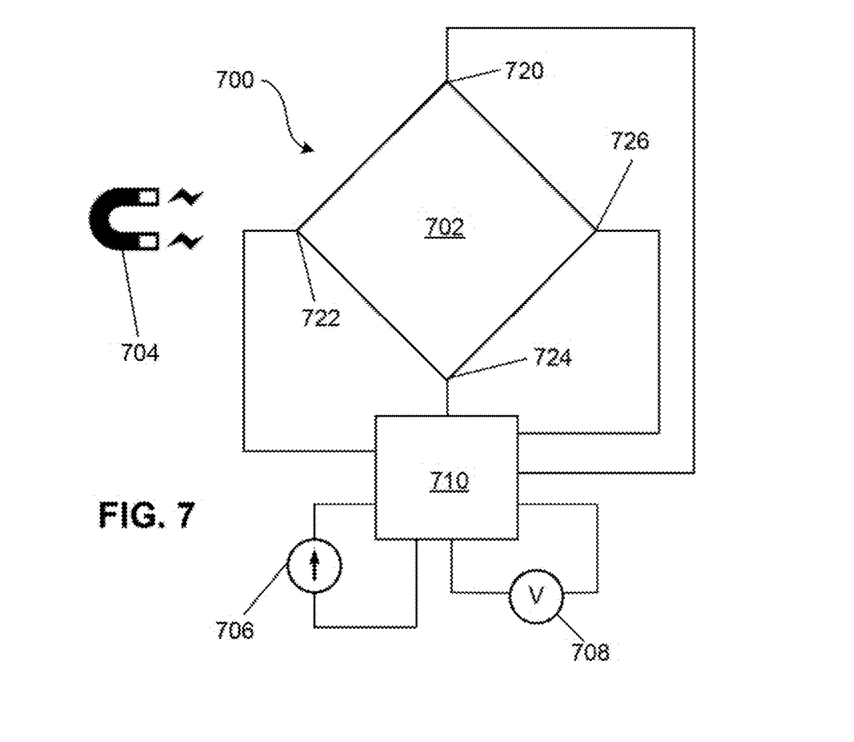
FIG. 7 is an exemplary system for measuring a Hall voltage according to the present invention.

FIG. 7 shows a schematic diagram of an exemplary system 700 according to the present invention used to measure the Hall voltage of a piece of material 702. The system 700 includes a magnet 704 for creating a magnetic field. The magnet 704 can be any suitable magnet, with the understanding that more powerful magnets may be necessary to induce a measurable Hall voltage in heavily doped materials. For example, magnets capable of generating a 1 T or greater field, and for some applications, superconducting magnets of 9 T or greater may be necessary. For the exemplary system of FIG. 7, typical values for the n cycle times would be 0.5 to 5 seconds and typical values for the m cycle times would also be 0.5 to 5 seconds, though other values are contemplated, such as, but not limited to, 0.5 seconds each for n and m cycle times, 1 second each for m and n cycle times, 5 seconds each for n and m cycle times or 0.5 seconds for n cycle times and 1.5 seconds for m cycle times. The value of n and m for these cycle times might be on the order of 100. This provides a high quality Hall voltage measurement in 10 seconds or less. This time should be compared to the approximately 1 hour that a similar-quality Hall measurement using the AC field method would require. This is a factor of over 300 improvement in the measurement time of the sample.

The exemplary system 700 also includes current source 706, which can be any standard DC current source, [for example Keithley 6220]. The system 700 further includes a voltage-measuring device 708 capable of measuring a voltage signal, [such as Signal Recovery 7230 lock in amplifiers].

The current source 706 and voltage-measuring device 708 are connected to a controller 710. The controller 710 may be, for example, an array of switches. The controller 710 is in turn connected to four contact points, 720, 722, 724, and 726 of material 702. The controller 710 is configured to change which of the contact points 720, 722, 724, and 726 are connected to the current source 706 and which are connected to the voltage measuring device 708 at any given time, facilitating fast switching of the states of the above-described methods.

The method described herein uses a current source as the excitation for the measurement. Another embodiment may use a voltage source (such as a Keysight B2987A electrometer) and a current meter (such as a Keithley 6485) to measure the current produced by the voltage source. These instruments would replace the current source 706 in FIG. 7.

Figure 8A:
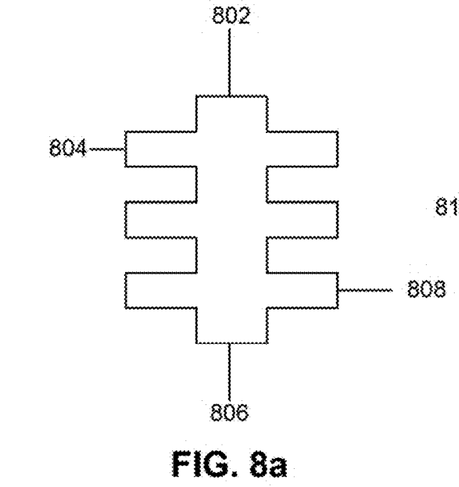
FIGS. 8a and 8b are schematic diagrams of exemplary material shapes measured by a Hall sensing device according to the present invention.
Figure 8B:
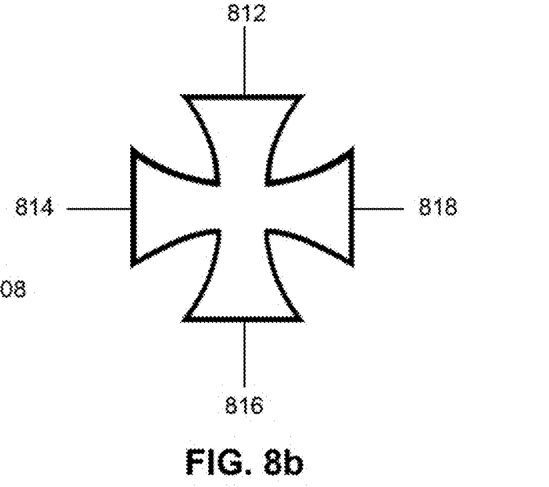

FIGS. 8a and 8b depict two exemplary shapes for a piece of material measured according to the present invention. One of ordinary skill in the art would understand that other shapes are possible, given that geometries of material and the location of the contact points during measurement will have significant effects on the measurement result. FIG. 8a, for example, depicts a piece of material in a hall bar shape having contact points 802, 804, 806, and 808. FIG. 8b depicts a piece of material in a Greek cross shape, having contact points 812, 814, 816, and 818.

While the present invention has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Moreover, elements described with one embodiment may be readily adapted for use with other embodiments. Therefore, the invention, in its broader aspects, is not limited to the specific details, the representative apparatus, and illustrative examples shown and described. Accordingly, departures may be made from such details without departing from the spirit or scope of the general inventive concepts.

What is claimed is:

1. A method of measuring a Hall effect voltage for characterizing an electronic property of a material, the method comprising:
   providing an excitation across a first pair of opposing points of a piece of the material and concurrently measuring a first voltage across a second pair of opposing points of the piece of material in the presence of a known magnetic field (state 1);
   providing an excitation across the second pair of opposing points of the piece of material and concurrently measuring a second voltage across the first pair of opposing points of the piece of material in the presence of the known magnetic field (state 2);
   switching between state 1 and state 2 at a first frequency for a first period;
   providing an excitation across the first pair of opposing points of the piece of material in a direction opposite to the excitation of state 1 and concurrently measuring a third voltage across the second pair of opposing points of the piece of material in the presence of the known magnetic field (state 3);

provide an excitation across the second pair of opposing points of the piece of material in a direction opposite to the excitation of state 2 and concurrently measuring a fourth voltage across the first pair of opposing points of the piece of material in the presence of the known magnetic field (state 4);

switching between state 3 and state 4 at a second frequency for a second period;

switching between the first period and the second period at a third frequency for a third period, wherein the first frequency is different than the third frequency; and determining the Hall effect voltage induced by exciting the material in the presence of the known magnetic field based on the first voltage, the second voltage, the third voltage, and the fourth voltage measurements.

2. The method of claim 1, further comprising determining the Hall coefficient of the material based on the determined Hall effect voltage.

3. The method of claim 1, wherein determining the Hall effect voltage comprises removing a thermal electric voltage component from the voltage measurements.

4. The method of claim 1, wherein determining the Hall effect voltage comprises removing a misalignment voltage component from the voltage measurements.

5. The method of claim 1, wherein the first frequency and the second frequency are the same.

6. The method of claim 1, wherein the first period and the second period are the same.

7. The method of claim 1, wherein the first frequency and the second frequency are greater than the third frequency.

8. The method of claim 1, each excitation comprising a current directly applied using a current source.

9. The method of claim 1, each excitation comprising a current generated by applying a voltage using a voltage source.

10. The method of claim 1, further comprising the steps of:
creating a voltage measurement signal from the voltage measurements at states 1-4;
demodulating the voltage measurement signal; and
amplifying the voltage measurement signal.

11. The method of claim 1, wherein the material has a low carrier mobility.

12. The method of claim 1, wherein the material has a carrier mobility of less than 1 cm2/Vs.

13. The method of claim 1, wherein switching between states toggles the Hall effect voltage at the first frequency and toggles a misalignment voltage at the third frequency.

14. The method of claim 1, wherein at least one of the first period and the second period are less than 5 seconds.

15. The method of claim 1, wherein the first period and the second period are each less than 5 seconds.

16. The method of claim 1, wherein the third period is less than or equal to 10 seconds.

17. The method of claim 1, wherein at least one of the first period and the second period are less than 0.5 seconds.

18. The method of claim 1, wherein the first period and the second period are each less than 0.5 seconds.

19. The method of claim 1, wherein the third period is less than or equal to 1 second.

20. A method of measuring a Hall effect voltage for characterizing an electronic property of a material, the method comprising:

providing a first test state alternating a first test parameter at a first frequency, wherein the first test state comprises exciting the material by inducing current flow through the material in the presence of a known magnetic field;

providing a second test state alternating a second test parameter at a second frequency, wherein the second test state comprises exciting the material by inducing current flow through the material in the presence of the known magnetic field;

wherein the first test parameter is one of a direction of the current during the test excitation, a location of the test excitation, a direction of the known magnetic field, and a location of the known magnetic field, and the second test parameter is a different one of the direction of the current during the test excitation, the location of the test excitation, the direction of a known magnetic field and the location of the known magnetic field;

switching between the first test state and second test state at a third frequency, wherein the third frequency is less than the first frequency and the second frequency;

measuring a voltage across the material induced by exciting the material in the presence of the known magnetic field during the first and second test states; and determining the Hall effect voltage based on the voltage measurements.

21. The method of claim 20, wherein the excitation current flow, the known magnetic field, and the measured induced voltage are all arranged substantially perpendicular to each other.

22. A system for measuring a Hall effect voltage for characterizing an electronic property of a material, the system comprising:
a magnet;
a test excitation mechanism;
a voltage measuring device;
a controller configured to:
provide a first test state alternating a first test parameter at a first frequency, wherein the first test state excites the material by inducing current flow through the material in the presence of a known magnetic field created by the magnet; and provide a second test state alternating a second test parameter at a second frequency, wherein the second test state excites the material by inducing current flow through the material in the presence of the known magnetic field created by the magnet, wherein the first test parameter is one of a direction of the current during the test excitation, a location of the test excitation, a direction of the known magnetic field, and a location of the known magnetic field, and the second test parameter is a different one of the direction of the current during the test excitation, the location of the test excitation, the direction of a known magnetic field and the location of the known magnetic field;

switch between the first test state and second test state at a third frequency, wherein the third frequency is less than the first frequency and the second frequency, such that the Hall effect voltage is toggled at a different frequency than a misalignment voltage;

measure a voltage across the material induced by exciting the material in the presence of the known magnetic field during the first and second test states; and determine the Hall effect voltage based on the voltage measurements.

23. The system of claim 22, wherein the controller is further configured to create a voltage measurement signal based on the voltage measurements, and the system further comprises:
   a demodulator configured to demodulate the voltage measurement signal, wherein the Hall effect voltage is separated from the voltage measurement signal; and
   an amplifier to amplify the demodulated signal.

24. The system of claim 22, the test excitation mechanism comprising a source of current.

25. The system of claim 22, the test excitation mechanism comprising a voltage source and a current measuring device.

26. The system of claim 22, wherein the material has a low carrier mobility.

27. The system of claim 22, wherein a test piece of material has a substantially square shape.

28. The system of claim 22, wherein a test shape of the material is a square or a Greek cross.

29. A method of measuring a Hall effect voltage for characterizing an electronic property of a material, the method comprising:
   providing an excitation through the material in an excitation direction in the presence of a known magnetic field arranged in a magnetic field direction and concurrently measuring a voltage induced across the material in a measurement direction, wherein the excitation direction, the magnetic field direction, and the measurement direction are all different than each other;
   switching at least one of the excitation direction, the magnetic field direction, and the measurement direction between two directions at a first frequency;
   switching at least one of the excitation direction, the magnetic field direction, and the measurement direction between two directions at a second frequency, wherein the second frequency is different than the first frequency;
   determining the Hall effect voltage based on the measured voltage during the switching.

30. The method of claim 29, wherein the voltage measurement comprises a Hall voltage toggling at the first frequency.

31. The method of claim 29, wherein the voltage measurement comprises a misalignment voltage toggling at the second frequency.

* * * * *